United States Patent
Jeon (12)

(10) Patent No.: US 6,451,223 B1
(45) Date of Patent: Sep. 17, 2002

(54) THINNER COMPOSITION AND METHODS AND SYSTEMS FOR USING THE THINNER COMPOSITION

(75) Inventor: Mi-sook Jeon, Yongin (KR)

(73) Assignee: Samsung Electronics Co., Ltd., Suwon (KR)

(*) Notice: Subject to any disclaimer, the term of this patent is extended or adjusted under 35 U.S.C. 154(b) by 0 days.

(21) Appl. No.: 09/874,221

(22) Filed: Jun. 6, 2001

Related U.S. Application Data

(62) Division of application No. 09/338,798, filed on Jun. 23, 1999, now Pat. No. 6,261,970.

(30) Foreign Application Priority Data

Jun. 26, 1998 (KR) .............................. 98-24463

(51) Int. Cl.[7] .................... C09K 13/02; H01L 21/30; H01L 21/302
(52) U.S. Cl. .................. 252/79.1; 438/745; 252/79.4
(58) Field of Search .................. 252/79.4, 79.1; 438/745

(56) References Cited

U.S. PATENT DOCUMENTS

| | | | |
|---|---|---|---|
| 4,497,890 A | 2/1985 | Helbert | 430/190 |
| 4,686,280 A | 8/1987 | Ogura | 118/52 |
| 5,501,943 A | 3/1996 | Swirbel | 430/296 |
| 5,718,763 A | 2/1998 | Tateyama et al. | 430/313 |
| 6,261,970 B1 * | 7/2001 | Jeon | 438/745 |

FOREIGN PATENT DOCUMENTS

| | | | | |
|---|---|---|---|---|
| GB | 211667 A2 * | 2/1987 | | G03F/7/08 |
| GB | 562819 A2 * | 9/1993 | | G03F/7/004 |
| GB | 629671 A2 * | 12/1994 | | C09D/9/00 |
| KR | 90-5345 | 7/1990 | | |

* cited by examiner

Primary Examiner—Benjamin L. Utech
Assistant Examiner—Lynette T. Umez-Eronini
(74) Attorney, Agent, or Firm—Volentine Francos, PLLC

(57) ABSTRACT

Thinner compositions for effectively removing photoresist. The thinner compositions may be used in reworking a semiconductor substrate or in rinsing semiconductor devices. The thinner composition may be a mixture of n-butyl acetate (n-BA) and ethyl acetate (EA), a mixture of n-butyl acetate (n-BA) and methyl methoxy propionate (MMP), or a mixture of n-butyl acetate (n-BA) and methyl ethyl ketone (MEK).

6 Claims, 4 Drawing Sheets

THINNER COMPOSITION AND METHODS AND SYSTEMS FOR USING THE THINNER COMPOSITION

CROSS-REFERENCE TO RELATED APPLICATIONS

This is a Divisional of application Ser. No. 09/338,798, filed Jun. 23, 1999, the entirety of which is incorporated herein by reference, which is now U.S. Pat. No. 6,261,970.

BACKGROUND OF THE INVENTION

1. Field of the Invention

The present invention relates to the field of electronic device fabrication including semiconductor device fabrication, and flat panel display fabrication, preferably Liquid Crystal Display (LCD) fabrication, and more particularly, to thinner compositions for selectively removing photoresist.

2. Description of the Related Art

Photoetching is used to form circuit patterns on semiconductor substrates or flat panel display substrates, for example, glass or quartz, on specific layers that have previously been formed on the substrate. Photoetching is typically carried out by coating photoresist on the substrate and causing a photo-chemical reaction on the substrate.

More particularly, a photoetching process typically involves first coating a primer over the semiconductor substrate. The primer improves the adhesiveness of the photoresist to the substrate. The photoresist is then coated onto the primer. A rinsing step is used to remove unwanted photoresist that was coated on the edges or backside of the semiconductor substrate. Subsequently, a soft baking step is used to remove solvent inside the photoresist to improve the adhesiveness of the photoresist to the semiconductor substrate. Thereafter, the photoresist is exposed and developed to create a predetermined photoresist pattern on the substrate.

The photoresist pattern formed as outlined above is used either as an etching mask for selectively etching the semiconductor substrate, as an etching mask for etching specific sublayers of the substrate, as an ion-injection mask for injecting ions into the semiconductor substrate, or as an ion-injection mask for injecting ions into a sublayer of the substrate.

Occasionally, the photoetching process results in failure. In this case, the substrate may still be saved by removing the photoresist coated on the substrate and recoating with new photoresist. This is referred to as reworking the substrate.

Chemicals known as thinners are used to remove the photoresist when reworking the substrate. The specific thinner to use differs depends on the chemistry of the substrate layer(s) below the photoresist. For example, sulfuric acid ($H_2SO_4$), or a mixture of sulfuric acid ($H_2SO_4$) and hydrogen peroxide ($H_2O_2$) is used to strip photoresist when the sublayer is a non-metallic layer, while n-butyl acetate (n-BA) is used to rework the substrate when the sublayer is a metallic layer. In other words, sulfuric acid ($H_2SO_4$) or a mixture of sulfuric acid ($H_2SO_4$) and hydrogen peroxide ($H_2O_2$) cannot be used to remove photoresist coated on a metallic layer, and n-butyl acetate (n-BA) cannot be used to remove photoresist coated on a non-metallic layer.

A consequence of having to use different thinners depending on the type of layer the photoresist is coated on is that a separate rework apparatus is required for each thinner. Additionally, complications can occur if the photoresist applied in the second photoetching process is incompatible with the thinner used when reworking the substrate. Conventionally, this incompatibility dictated that a different thinner or rework apparatus had to be used. Having multiple rework apparatuses decreases productivity and increases cost. Therefore, there is a need in the art for a chemical thinner that is compatible with the process of reworking the substrate and with a wide variety of photoresists.

A second problem associated with conventional thinners is that many of the conventional thinners with the necessary solubility, volatility, and viscosity for use in reworking a substrate or for use in a rinse process are toxic. Conventional thinners include ethyleneglycol monoethylether acetate (ECA), propyleneglycol monomethylether acetate (PGMEA), ethyl lactate (EL), methyl isobutyl ketone (MIBK), and n-butyl acetate (n-BA). Ethyleneglycol monoethylether acetate (ECA) has a good solubility rate, however, its volatility and flammability is unacceptably high, further, it is toxic to humans if inhaled or contacted on the skin. The toxic effects of ethyleneglycol monoethylether acetate (ECA) include leukopenia and miscarriage of an embryo. The solubility rate of propyleneglycol monomethylether acetate (PGMEA) and ethyl lactate (EL) is too low to selectively rinse photoresist from the edges or the backside of the wafer.

As previously mentioned, the rinsing step is typically carried out during manufacturing to remove any photoresist that is unnecessarily coated on the edges or the backside of the semiconductor substrate during the photoetching process. Unwanted photoresist remaining on the edges or the backside of the wafer can cause etching failure or can generate particle contamination during subsequent processing, such as during etching or ion-injection, thereby decreasing the production yield. Conventionally, in order to remove photoresist from the edges or the backside of the wafer, spray nozzles are provided above and below the wafer edge so that thinner can be sprayed onto the edges or the backside of the wafer. Thinner performance in selectively removing unwanted photoresist is determined by its solubility rate, volatility, and viscosity.

The solubility rate of a thinner determines how effectively the thinner can dissolve and remove photoresist. With respect to volatility, the thinner should easily evaporate after removing the photoresist so that it does not remain on the surface of the wafer as a potential source of pollution in subsequent processing steps. If the volatility of the thinner is too low, the thinner may remain on the edge portion of the wafers, particularly at the flat zone used in aligning the wafers after spin drying. If the thinner does not evaporate, it will build-up on the photoresist layer after development causing a lump of photoresist to form in the flat zone portion. This reduces the yield of the semiconductor devices.

Proper viscosity is essential to facilitate spraying the thinner through the nozzles. If the viscosity is too high, an excessively high spraying pressure is required. If viscosity is too low, the spray focus will deteriorate because the thinner cannot be concentrated or focused on the contact position of the wafer which interferes with the ability of the thinner to selectively remove unwanted photoresist during rinsing. Particularly, with respect to edge rinsing, the thinner must have the proper solubility rate in order to ensure a smooth wafer cross section after treatment.

Methyl isobutyl ketone (MIBK) is now widely used for rinsing photoresist, however, its high volatility can give operators headaches. Further, it can contaminate the air inside a cleanroom, cause accumulation of photoresist on the edge of the wafer because of its high volatility rate on the surface of the wafer, and cause photoresist powder to stick to the exhaust duct, thereby requiring frequent cleaning of the exhaust duct.

A rinse method using a solvent comprising an ether compound represented by the general formula of $R^1$—O—(—$CHR^2$—$CH_2$—O—)$_n$—H was disclosed in Korean Patent Publication No. 90-5345. According to the publication, the rinse solvent is nontoxic. This solvent may be used to remove or peel off a photoresist layer by completely immersing a wafer coated with photoresist in the solvent. However, this solvent cannot be sprayed onto a wafer to selectively remove the unwanted photoresist (i.e., remove the photoresist from the edge and backside portions of the wafer) because the viscosity is too high.

U.S. Pat. No. 4,686,280 discloses a positive-type photoresist including a trimethyl silyl nitrile used as a solvent of photoresist. Specifically, the '280 patent discloses mixing of 1,2-ethoxyl acetate, methyl ethyl ketone (MEK), xylene, and n-butyl acetate (n-BA), or use of mixtures including two or more of these chemicals, but the '280 patent does not disclose using the mixture for rinsing.

Accordingly, there remains a need for a nontoxic thinner that has the proper solubility, volatility, and viscosity rates for use in removing certain photoresists during a rework process, or for use during the rinse process for semiconductor devices. There is also a need for a reliable rework method and a method of manufacturing semiconductor devices using thinner.

SUMMARY OF THE INVENTION

The present invention relates to a number of different improved thinners. As used herein, thinner refers to any composition that can be used to remove photoresist.

One thinner composition consistent with the present comprises a mixture of n-butyl acetate (n-BA) and ethyl acetate (EA). In other aspects consistent with the present invention, the thinner composition comprises a mixture of n-butyl acetate (n-BA) and methyl methoxy propionate (MMP), or a mixture of n-butyl acetate (n- BA) and methyl ethyl ketone (MEK).

Additional systems and methods consistent with the present invention relate to the use of the thinner compositions in reworking a semiconductor device or in rinsing a semiconductor device.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are incorporated in and constitute a part of this specification, illustrate several embodiments consistent with this invention, in which.

DETAILED DESCRIPTION OF THE PREFERRED EMBODIMENTS

Reference will now be made in detail to embodiments of the invention, examples of which are illustrated in the accompanying drawings. Wherever possible, the same reference numbers will be used throughout the drawings to refer to the same or like parts.

A thinner composition consistent with the present invention comprises a mixture of 80–90% by weight of n-butyl acetate (n-BA) and 20–10% by weight of ethyl acetate (EA). Preferably, the composition comprises a mixture of 80% by weight of n-butyl acetate (n-BA) and 20% by weight of ethyl acetate (EA).

The n-butyl acetate (n-BA) has a low volatility rate, and ethyl acetate (EA) has a high solubility rate for photoresist. The above-described mixture of these two compounds achieves a thinner having a proper volatility rate and solubility rate for photoresist removal.

A second thinner composition consistent with the present invention comprises a mixture of 70 to 80% by weight of n-butyl acetate (n-BA) and 30 to 20% by weight of methyl methoxy propionate (MMP). Methyl methoxy propionate (MMP) has a high solubility rate and when mixed with n-butyl acetate (n-BA), a thinner composition is formed having the proper volatility rate and solubility rate for removing photoresist.

Another thinner composition consistent with the present invention comprises a mixture of 80 to 90% by weight of n-butyl acetate (n-BA) and 20 to 10% by weight of methyl ethyl ketone (MEK). Methyl ethyl ketone (MEK) has a high solubility rate and when mixed with n-butyl acetate (n-BA), a thinner composition is formed having the proper volatility rate and solubility rate for removing photoresist.

The Threshold Limit Value (TLV) is a standard defining the permitted air concentration of specified chemicals. That is, the TLV concentration of a chemical in the air is a threshold value at which the chemical has been judged to do no harm to humans exposed to the chemical. Higher TLV values indicate decreasing toxicity. The TLV is annually determined by the American Conference of Governmental Industrial Hygienists.

The TLV values of n-butyl acetate (n-BA), ethyl acetate (EA), methyl methoxy propionate (MMP), and methyl ethyl ketone (MEK) are 710 ppm, 1,400 ppm, 260 ppm, and 590 ppm, respectively. These compounds are safer than the widely used conventional compound, methyl isobutyl ketone (MIBK), having a TLV of 205 ppm.

Figure 1:
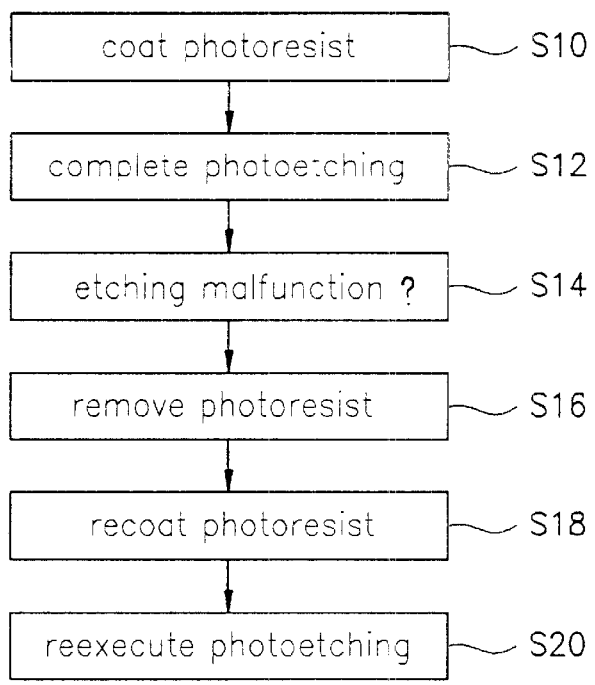
FIG. 1 is a flow chart illustrating a processing sequence for manufacturing a semiconductor device according to an embodiment of a rework method undertaken due to etching failures.

FIG. 1 is a flow chart illustrating a processing sequence for manufacturing an electronic device including a semiconductor device and flat panel display device, for example, a Liquid Crystal Display (LCD), according to an embodiment of a rework method undertaken due to etching failures. A photoresist layer is coated onto a wafer (S10) to form a predetermined pattern and the coated wafer is photoetched (S12). The wafer is an electronic device substrate including a semiconductor substrate (e.g., a silicon substrate, a GaAs substrate, etc.) and flat panel display substrate (e.g., glass or quartz). If an etching malfunction (S14) occurs during the photoetching process causing an etching failure, such as an exposure failure or a pattern failure, the rework process is performed by removing all of the photoresist that was unsuccessfully coated onto the wafer during the photoetching process (S16).

After removal of the original, failed photoresist, a new layer of photoresist is "re-coated" onto the wafer to form a predetermined pattern (S18). Conventional photoetching can then be performed (S20).

Figure 2:
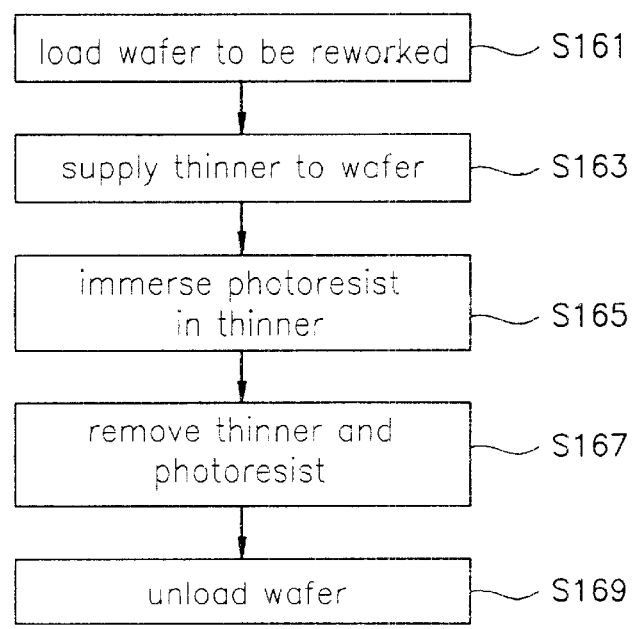
FIG. 2 is a flow chart depicting detailed processing steps of the rework method according to an embodiment of the present invention.
Figure 4:
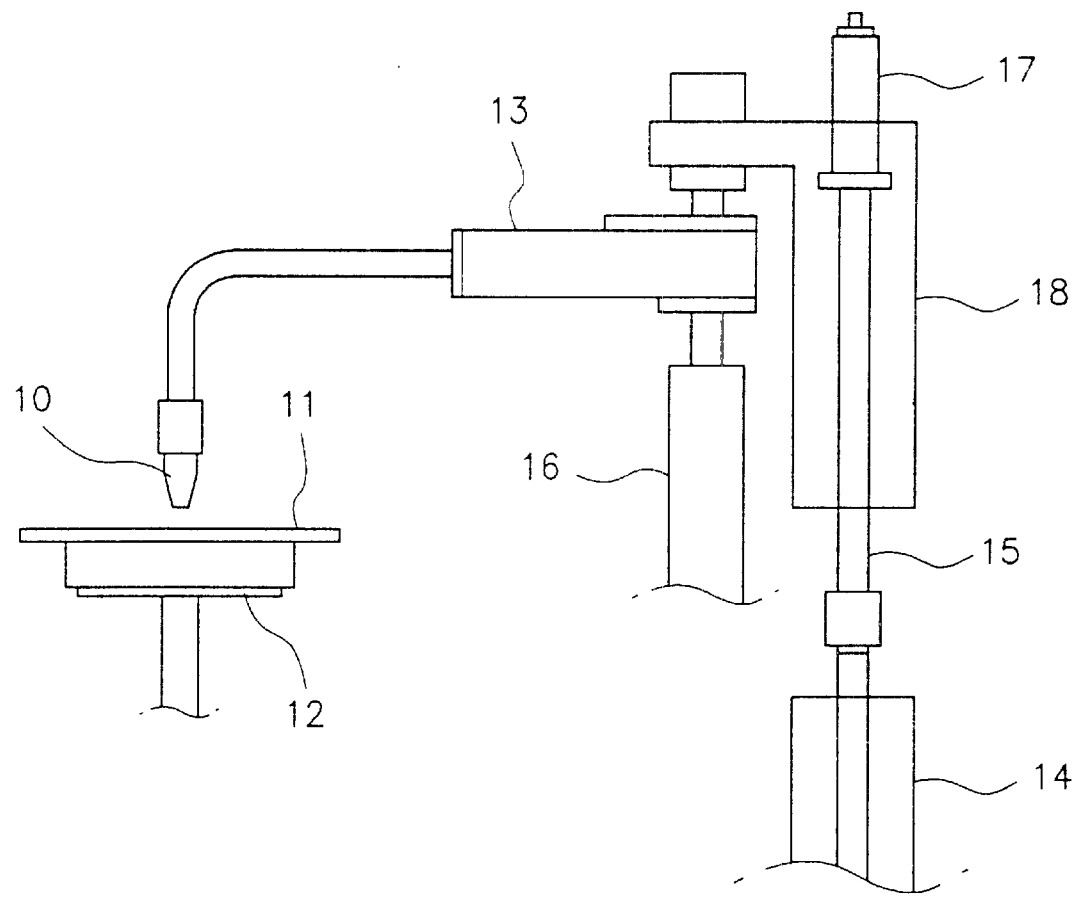
FIG. 4 is a schematic diagram of a rework apparatus consistent with an aspect of the present invention.

FIG. 2 is a flow chart illustrating a series of processing steps for reworking a substrate according to an embodiment of the present invention. FIG. 4 is a schematic diagram of a rework apparatus used to accomplish the method illustrated in FIG. 2.

Referring to FIG. 4, a wafer 11 is fixed by vacuum-suction to a rotatable vacuum chuck 12. A nozzle 10 supplies thinner, preferably a mixture of n-butyl acetate (n-BA) with either ethyl acetate (EA), methyl methoxy propionate (MMP), or methyl ethyl ketone (MEK), as described above. Nozzle 10 is installed on a rotatable arm 13, which is connected to a first support 16. The location of nozzle 10 over wafer 11 can be moved vertically by adjusting a cylinder 14, which is connected to a shaft 15. A second support 18 is connected to cylinder 14 by a fixing nut 17 and by shaft 15. The thinner composition is supplied to nozzle 10 through a thinner tube (not shown) installed inside arm 13.

The operation of the apparatus shown in FIG. 4 during a reworking will now be described with reference to FIGS. 2 and 4. The wafer to be reworked, wafer 11, is loaded on vacuum chuck 12 (S161). After wafer 11 is loaded, thinner composition is supplied to the wafer surface nozzle 10 (S163). The thinner composition consistent with the present invention uniformly dissolves the photoresist. The solubility rate of the photoresist across the entire wafer is optimized by rotating vacuum chuck 12 with the wafer fixed thereon so that the thinner supplied to the wafer center spreads to the wafer edge.

The thinner composition is typically left on the wafer for about 5 minutes or less (S165). The duration of exposure to the thinner may vary based on the amount and the thickness of the unwanted photoresist. To remove the photoresist dissolved by the thinner, vacuum chuck 12 is rotated at high speed, typically for about 30 seconds (S167). Finally, the wafer is unloaded from vacuum chuck 12 completing the reworking process (S169).

The photoresist used in the apparatus shown in FIG. 4 may be any of a number of commercially available photoresists, including but not limited to HKT 501 supplied by Hoechest Korea Co., Ltd. in Korea. The thinners used are preferably any of the previously described thinners of the present invention, which include: the n-butyl acetate and ethyl acetate mixture; the n-butyl acetate and methyl methoxy propionate mixture; and the n-butyl acetate and methyl ethyl ketone mixture.

Figure 5:
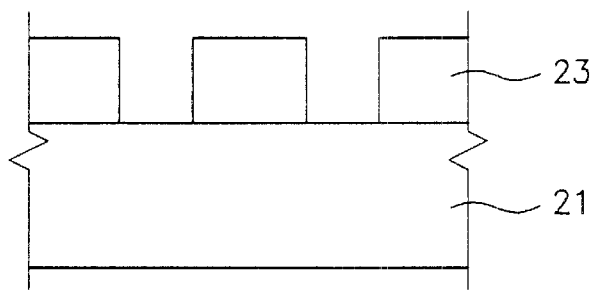
FIGS. 5 to 7 are cross-sectional views of exemplary wafers requiring rework.
Figure 6:
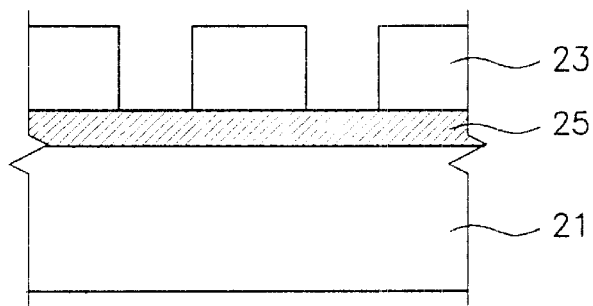
Figure 7:
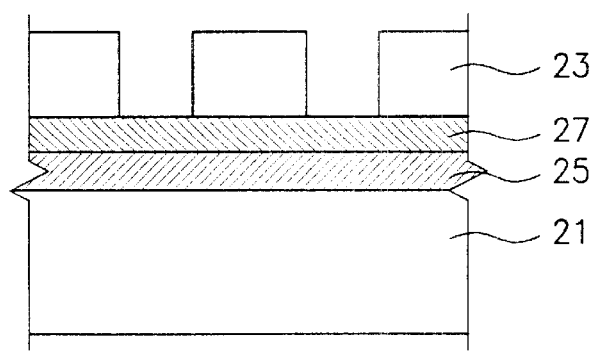

FIGS. 5 to 7 are cross-sectional views of exemplary wafers requiring rework.

A wafer 21 in FIG. 5 requires rework due to an etching failure occurring in a photoresist 23 that was directly coated onto wafer 21. Wafer 21 in FIG. 6 requires rework due to an etching failure occurring during photoetching after photoresist 23 is coated onto an insulating layer 25 formed over wafer 21. Insulating layer 25 may be an oxide layer or a nitride layer. Wafer 21 in FIG. 7 requires rework due to an etching failure occurring during photoetching of photoresist 23 after forming an insulating layer 25 and a metallic layer 27. The metallic layer 27 may be an aluminum layer.

Consistent with the present invention, reworking of the substrate can be carried out using the same thinner composition whether photoresist is directly coated onto a wafer or whether the photoresist is coated onto intervening insulating or metallic layers. This is a significant advantage compared to conventional thinners. Moreover, in contrast to conventional methods which tend to leave several angstroms of photoresist after reworking the substrate, little or no remaining photoresist was detected when thinner consistent with the present invention was used. Therefore, the reworking method consistent with the present invention provides a yield similar to or better than that of the conventional rework process, while improving the amount of photoresist that is removed.

Figure 3:
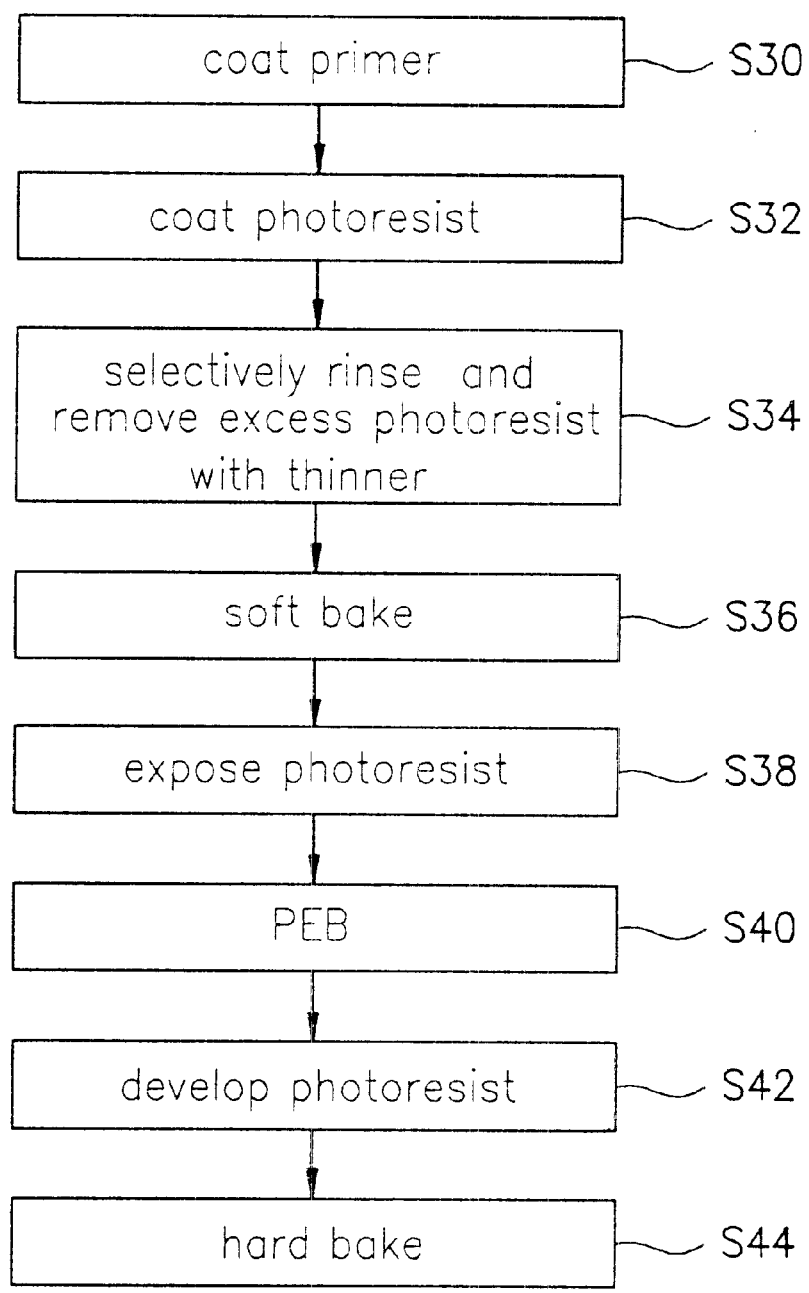
FIG. 3 is a flow chart showing a process sequence for a rinsing step used in the removal of photoresist according to an aspect of the present invention.

FIG. 3 is a flow chart illustrating a rinsing process consistent with the present invention for removing photoresist. A primer is coated on the wafer in order to improve the adhesiveness of the photoresist coated onto the wafer (S30). The primer can be coated directly onto a wafer, or onto an intermediate insulating layer or a metallic layer. Commercially available Hexamethylenedisilazane (HMDS) is one example of a suitable primer. Photoresist is then coated onto the primer to form a predetermined pattern (S32) on the wafer.

Any photoresist that was unnecessarily coated onto the wafer, such as on the edges or on the backside of the wafer, is removed and rinsed away by spraying thinner onto the wafer (S34). Preferably, the thinner is a mixture of one of: 80–90% by weight of n-butyl acetate (n-BA) and 20–10% by weight of ethyl acetate (EA); 70 to 80% by weight of n-butyl acetate (n-BA) and 30 to 20% by weight of methyl methoxy propionate (MMP); or 80–90% by weight of n-butyl acetate (n-BA) and 20–10% by weight of methyl ethyl ketone (MEK).

After rinsing the unnecessarily coated photoresist from the edges and backside of the wafer, the wafer is soft-baked in order to improve the adhesiveness of the photoresist to the wafer and to remove solvent (S36).

Then, the wafer is exposed by selectively projecting light, for example ultraviolet light, onto the wafer through a mask or reticle in order to form a predetermined pattern on the photoresist layer (S38). Then, a Post-Exposure Bake (PEB) is carried out in order to recover the stability of the chemical structure and to prevent an incorrect pattern from forming by the unnecessary exposure of the exposure interface to scattered ultraviolet light (S40).

The photoresist undergoes a photochemical reaction by exposure to this light. The exposed photoresist is then selectively removed by developing the photoresist layer (S42). The wafer is then hard baked in order to stabilize the pattern (S44).

Once the photoresist pattern has been formed and stabilized, a typical etching process or ion-injection process is executed according to the photoresist pattern.

Several exemplary embodiments and comparative examples of the methods and devices consistent with the present invention will now be described. These embodiments are given by way of example only. The present invention is not limited to these embodiments. One of ordinary skill will appreciate that many variations of these examples may be made within the scope of the present invention.

Embodiments 1 to 12

After mixing n-butyl acetate (n-BA) with either ethyl acetate (EA), methyl methoxy propionate (MMP), or methyl ethyl ketone (MEK) according to the mixing ratio as shown in Table 1 (below), the solubility rate and the volatility of each of the thinner compositions were measured. The results are indicated in the Table 1.

The photoresist coated on the surface of the wafer is HKT501 available from Hoechest Korea Co., Ltd. in Korea.

It is coated to a thickness of 15,000 angstroms, and the wafer having the photoresist coated thereon is baked at a temperature of 80 ° C. for 45 seconds. Then, the solubility rate of each thinner composition for the photoresist was measured.

Volatility was measured using an easy and widespread volatility measuring method, in which each thinner composition is put into a container having an opening diameter of 10 cm and the change in weight of the thinner composition with respect to time is measured.

COMPARATIVE EXAMPLES 1 TO 4

The conventional thinner methyl isobutyl ketone (MIBK) was compared to the thinners contemplated by the present invention. The solubility rate and the volatility of each were measured in the same manner as in the "Embodiments 1 to 12" section. The results are shown in Table 1. Note that while the specific volatility rates for Comp. Ex. 2 and Comp. Ex. 3 are not identified in Table 1, the volatility rates for EA and MMP are higher than nBA, the ratio generally being on the order of nBA: EA: MMP=1:5:3.

TABLE I

|  |  | solubility rate (Å/sec.) | Volatility rate (mg/hr.) | | | | | | |
|---|---|---|---|---|---|---|---|---|---|
|  |  |  | 1 | 2 | 3.5 | 4 | 6 | 18.5 | 26 |
| Embod. 1 | nBA:EA = 9:1 | 4,130 | 1.1 | — | 2.4 | — | — | 8.6 | — |
| Embod. 2 | nBA:EA = 8:2 | 5,506 | 1.5 | — | 3.0 | — | — | 10.1 | — |
| Embod. 3 | nBA:EA = 7:3 | 10,127 | 2.6 | — | 6.8 | — | — | 16.3 | — |
| Embod. 4 | nBA:EA = 6:4 | 13,287 | 3.1 | — | 7.9 | — | — | 18.4 | — |
| Embod. 5 | nBA:MMP = 9:1 | 3,679 | 0.9 | — | 1.3 | — | — | 4.0 | — |
| Embod. 6 | nBA:MMP = 8:2 | 5,732 | 1.0 | — | 1.8 | — | — | 5.1 | — |
| Embod. 7 | nBA:MMP = 7:3 | 9,589 | 1.1 | — | 2.1 | — | — | 9.2 | — |
| Embod. 8 | nBA:MMP = 6:4 | 11,893 | 2.4 | — | 4.1 | — | — | 11.4 | — |
| Embod. 9 | nBA:MEK = 9:1 | 7,296 | 1.2 | — | 2.6 | — | — | 8.1 | — |
| Embod. 10 | nBA:MEK= 8:2 | 10,152 | 1.0 | — | 2.1 | — | — | 7.2 | — |
| Embod. 11 | nBA:MEK= 7:3 | 15,400 | 2.4 | — | 5.4 | — | — | 12.7 | — |
| Embod. 12 | nBA:MEK= 6:4 | 21,695 | 3.0 | — | 8.4 | — | — | 16.8 | — |
| Comp. Ex. 1 | nBA | 3,672 | — | 2.2 | — | 2.85 | 3.4 | — | 8.8 |
| Comp. Ex. 2 | EA | 18,668 |  |  |  |  |  |  |  |
| Comp. Ex. 3 | MMP | 16,367 |  |  |  |  |  |  |  |
| Comp. Ex. 4 | MIBK | 4,878 | — | 2.1 | — | 2.6 | 3.8 | — | 12.8 | nBA: n-butyl acetate
EA: ethyl acetate
MMP: methyl methoxy propionate
MIBK: methyl isobutyl ketone
MEK: methyl ethyl ketone As shown in the Table 1, and as compared with the conventional methyl isobutyl ketone (MIBK), the thinner composition comprising a mixture of n-butyl acetate (n-BA) and ethyl acetate (EA) by mixing ratio of (8 to 9):(2 to 1), or a mixture of n-butyl acetate (n-BA) and methyl methoxy propionate (MMP) by mixing ratio of (7 to 8): (3 to 2), or a mixture of n-butyl acetate (n-BA) and methyl ethyl ketone (MEK) by mixing ratio of (8 to 9):(2 to 1) shows a solubility rate similar to that of the methyl isobutyl ketone (MIBK), or higher, and low volatility rate, i.e., a lower toxicity.

In summary, the thinner compositions discussed herein provide a solubility rate sufficient to dissolve photoresist while also having properties of low toxicity and low volatility, thereby greatly improving the semiconductor manufacturing environment, and doing no harm to operators, while removing photoresist efficiently and safely. Further, effective substrate reworking methods for wafers were disclosed using the thinner compositions, both when photoresist is directly coated on a wafer or when coated on an intermediate insulating layer or a metallic layer over the wafer. Still further, methods of easily removing and rinsing off photoresist were discussed, in which photoresist unnecessarily coated on the edges or the back side of the wafer during the semiconductor devices fabrication processes was removed, thereby improving the production yield and the reliability.

Additional advantages and modifications will readily occur to those skilled in the art. Therefore, the invention in its broader aspects is not limited to the specific details, and representative devices, shown and described therein. Accordingly, various modifications may be made without departing from the spirit or scope of the general inventive concept as defined by the appended claims and their equivalents.

What is claimed is:

1. A thinner composition for removing photoresist on an electronic device substrate, said thinner composition consisting essentially of a mixture of n-butyl acetate (n-BA) and ethyl acetate (EA).

2. The thinner composition of claim 1, wherein n-butyl acetate comprises 80–90% by weight of the thinner composition and ethyl acetate comprises 20–10% by weight of the thinner composition.

3. The thinner composition of claim 1, wherein n-butyl acetate (n-BA) comprises 80% by weight of the thinner composition and ethyl acetate (EA) comprises 20% by weight of the thinner composition.

4. A thinner composition for removing photoresist on an electronic device substrate, said thinner composition consisting essentially of a mixture of n-butyl acetate (n-BA) and methyl methoxy propionate (MMP), wherein the n-butyl acetate (n-BA) comprises 70 to 80% by weight of the thinner composition and the methyl methoxy propionate (MMP) comprises 30 to 20% by weight of the thinner composition.

5. A thinner composition for removing photoresist on an electronic device substrate, said thinner composition consisting essentially of a mixture of n-butyl acetate (n-BA) and methyl ethyl ketone (MEK), wherein the n-butyl acetate (n-BA) comprises 80 to 90% by weight of the thinner composition and the methyl ethyl ketone (MEK) comprises 20 to 10% by weight of the thinner composition.

6. The thinner composition of claim 5, wherein n-butyl acetate (n-BA) comprises 80% by weight of the thinner composition and methyl ethyl ketone (MEK) comprises 20% by weight of the thinner composition.

* * * * *